(12) United States Patent
Fujii

(10) Patent No.: US 9,310,604 B2
(45) Date of Patent: Apr. 12, 2016

(54) ILLUMINATION OPTICAL DEVICE, ILLUMINATION METHOD, AND EXPOSURE METHOD AND DEVICE

(75) Inventor: Toru Fujii, Hiki-gun (JP)

(73) Assignee: NIKON CORPORATION, Tokyo (JP)

( * ) Notice: Subject to any disclaimer, the term of this patent is extended or adjusted under 35 U.S.C. 154(b) by 828 days.

(21) Appl. No.: 13/494,749

(22) Filed: Jun. 12, 2012

(65) Prior Publication Data

US 2012/0249989 A1 Oct. 4, 2012

Related U.S. Application Data

(63) Continuation of application No. PCT/JP2011/052184, filed on Feb. 2, 2011.

(30) Foreign Application Priority Data

Feb. 3, 2010 (JP) .................................. 2010-021853

(51) Int. Cl.
*G03B 27/72* (2006.01)
*G02B 26/08* (2006.01)
*G03F 7/20* (2006.01)

(52) U.S. Cl.
CPC ........ *G02B 26/0833* (2013.01); *G03F 7/70116* (2013.01); *G03F 7/70208* (2013.01); *G03F 7/70566* (2013.01)

(58) Field of Classification Search
CPC ............ G03F 7/70116; G03F 7/70208; G03F 7/70566; G02B 26/0833
USPC ..................................... 355/71; 359/290, 291
See application file for complete search history.

(56) References Cited

U.S. PATENT DOCUMENTS

| | | | |
|---|---|---|---|
| 6,900,915 B2 | 5/2005 | Nanjyo et al. | |
| 7,095,546 B2 | 8/2006 | Mala et al. | |
| 7,423,731 B2 | 9/2008 | Tanitsu et al. | |
| 8,094,290 B2 * | 1/2012 | Owa ................. | G02B 26/0833 355/67 |
| 8,462,317 B2 * | 6/2013 | Tanaka ................ | G03F 7/70075 355/53 |
| 8,913,227 B2 * | 12/2014 | Tanitsu ........................ | 355/67 |
| 2002/0191235 A1 * | 12/2002 | O'Connor ............ | G02B 27/283 359/9 |

(Continued)

FOREIGN PATENT DOCUMENTS

| | | |
|---|---|---|
| EP | 0 779 530 A1 | 6/1997 |
| EP | 1 420 298 A2 | 5/2004 |

(Continued)

OTHER PUBLICATIONS

Office Action issued in Japanese Patent Application No. 2011-552808 mailed on Sep. 2, 2014 (with translation).

(Continued)

*Primary Examiner* — Deoram Persaud
(74) *Attorney, Agent, or Firm* — Oliff PLC

(57) ABSTRACT

An illumination optical apparatus includes a light splitting device which splits the beam into a plurality of beams with respective polarization states different from each other, a spatial light modulation device which is arranged on at least one of a first optical path in which a first beam out of the plurality of beams travels and a second optical path in which a second beam out of the plurality of beams travels, and which has a plurality of optical elements arranged two-dimensionally and driven individually and a control device which controls the spatial modulation device to combine the first beam and the second beam at least in part.

23 Claims, 8 Drawing Sheets

(56) References Cited

U.S. PATENT DOCUMENTS

| | | | |
|---|---|---|---|
| 2003/0030781 A1* | 2/2003 | Bleeker et al. .................. 355/67 | |
| 2005/0068599 A1* | 3/2005 | Mushika ............. G03F 7/70291 | |
| | | 359/237 | |
| 2007/0122718 A1* | 5/2007 | Mizusako ........ B29D 11/00365 | |
| | | 430/5 | |
| 2007/0165202 A1* | 7/2007 | Koehler .................. G03F 7/702 | |
| | | 355/67 | |
| 2007/0242247 A1 | 10/2007 | Shiraishi | |
| 2009/0073411 A1* | 3/2009 | Tanitsu ............... G03F 7/70108 | |
| | | 355/67 | |
| 2009/0091730 A1* | 4/2009 | Tanaka ................ G03F 7/70291 | |
| | | 355/67 | |
| 2009/0097007 A1* | 4/2009 | Tanaka ................ G03F 7/70075 | |
| | | 355/67 | |
| 2009/0097094 A1* | 4/2009 | Tanaka ................ G03F 7/70075 | |
| | | 359/239 | |
| 2009/0109417 A1 | 4/2009 | Tanitsu | |
| 2009/0117494 A1* | 5/2009 | Owa .................. G03F 7/70116 | |
| | | 430/322 | |
| 2009/0135392 A1* | 5/2009 | Muramatsu ......... G03F 7/70116 | |
| | | 355/67 | |
| 2011/0096293 A1* | 4/2011 | Hirose .................. A61B 3/102 | |
| | | 351/206 | |
| 2011/0096337 A1* | 4/2011 | Hirose .................. A61B 3/102 | |
| | | 356/491 | |
| 2012/0171627 A1* | 7/2012 | Tanitsu ............... G01M 11/005 | |
| | | 430/325 | |

FOREIGN PATENT DOCUMENTS

| | | |
|---|---|---|
| JP | A-2002-353105 | 12/2002 |
| JP | A-2006-179660 | 7/2006 |
| JP | A-2009-105396 | 5/2009 |
| TW | 200935180 A | 8/2009 |
| WO | WO 2009/054541 A2 | 4/2009 |
| WO | WO 2009/087805 A1 | 7/2009 |
| WO | WO 2009/125511 A1 | 10/2009 |
| WO | WO 2009/150871 A1 | 12/2009 |

OTHER PUBLICATIONS

International Search Report issued in International Patent Application No. PCT/JP2011/052184 dated Mar. 22, 2011.

Apr. 28, 2015 Office Action issued in Taiwanese Patent Application No. 100104079.

Mar. 31, 2015 Office Action issued in Japanese Patent Application No. 2011-552808.

* cited by examiner

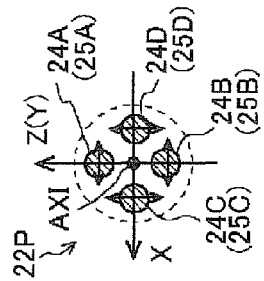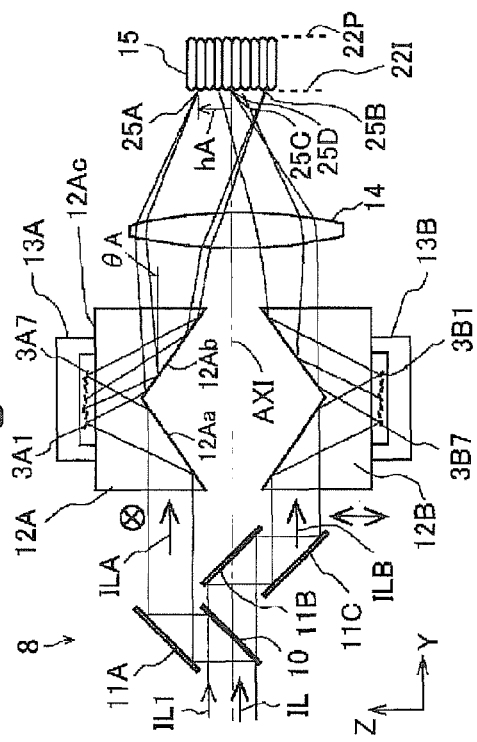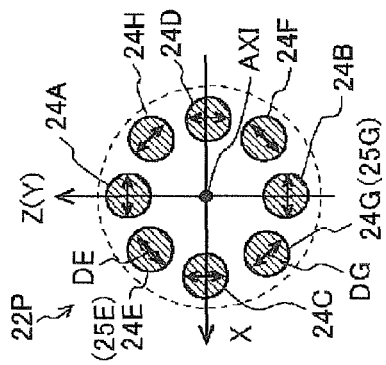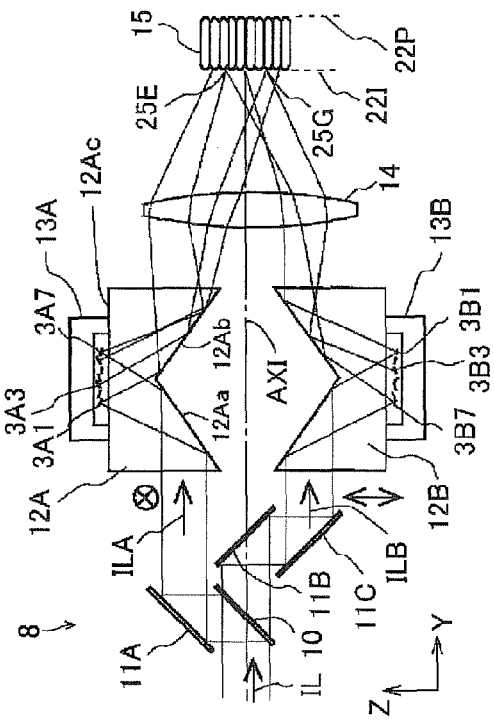

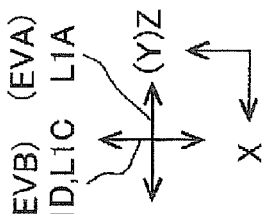
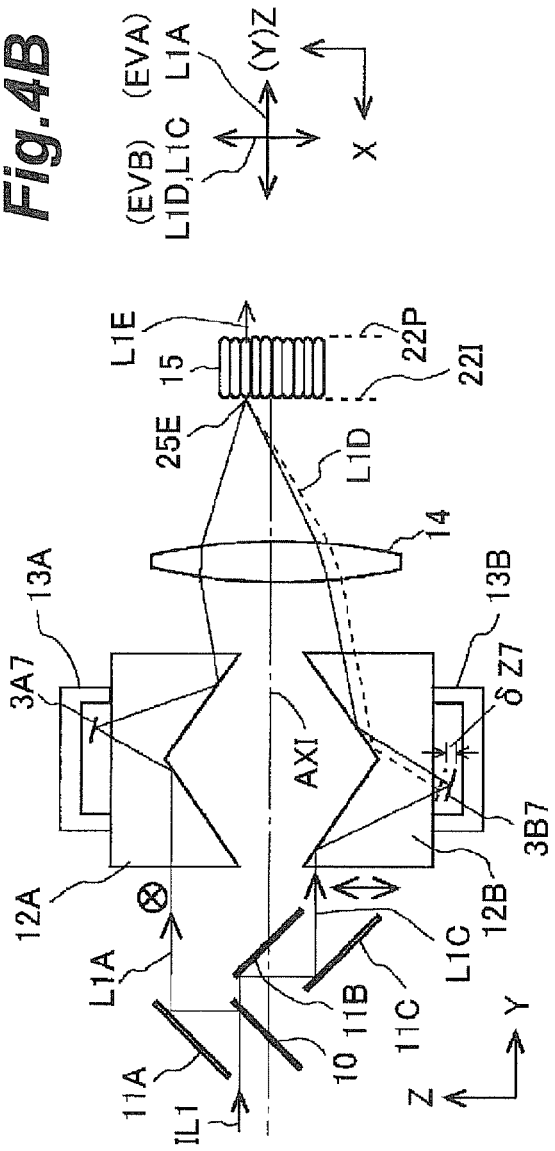
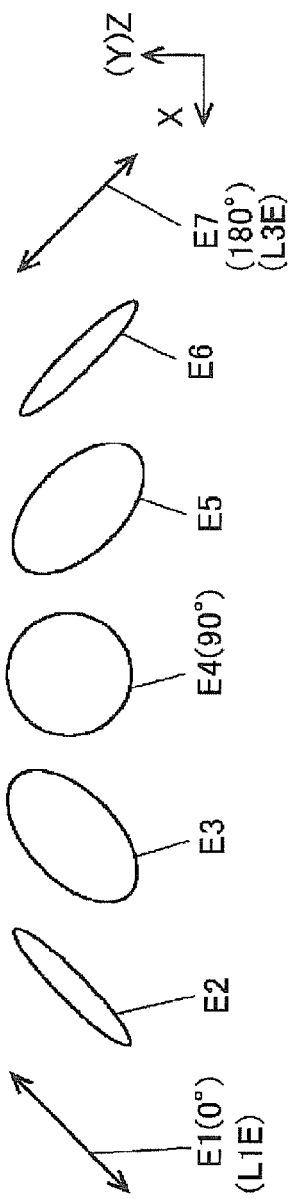

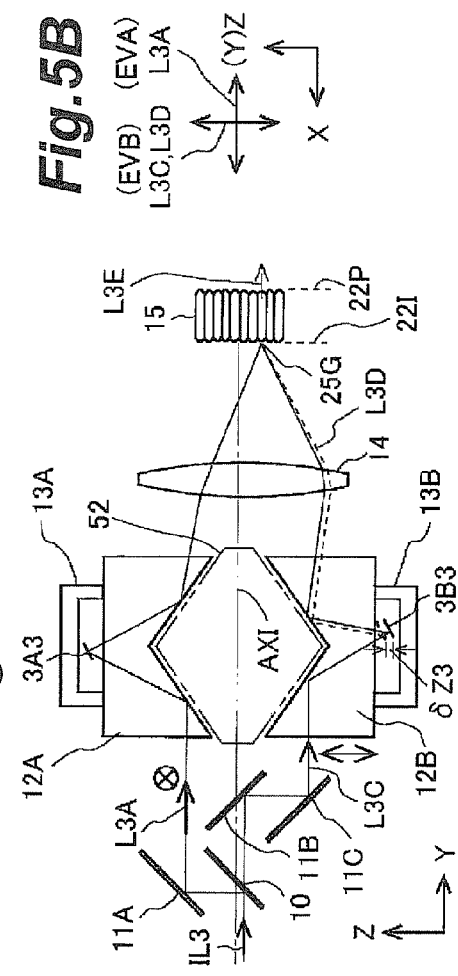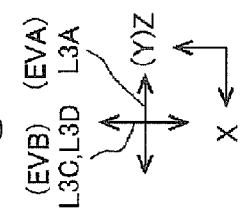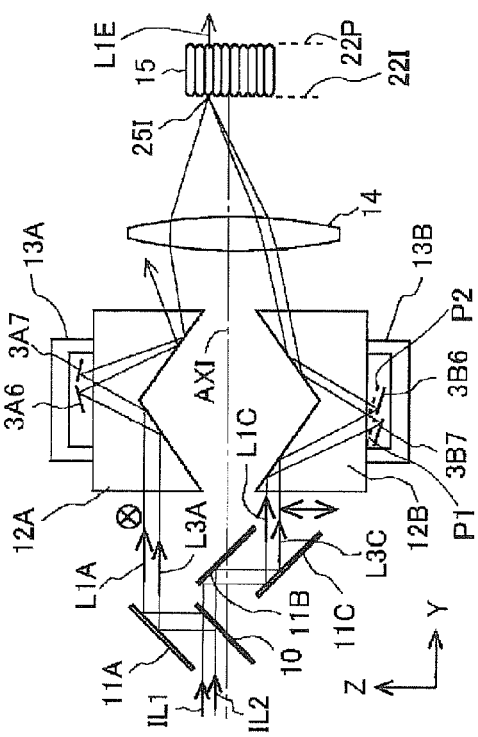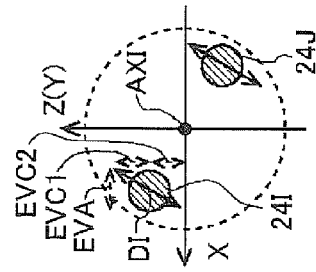

ILLUMINATION OPTICAL DEVICE, ILLUMINATION METHOD, AND EXPOSURE METHOD AND DEVICE

CROSS-REFERENCE TO RELATED APPLICATION

This application is a continuation application of PCT/JP2011/052184 filed on Feb. 2, 2011, which claims the benefit of priority of the Japanese Patent Application No. 2010-021853 filed on Feb. 3, 2010, the entire contents of which are incorporated herein by reference.

BACKGROUND

1. Field

One embodiment relates to an illumination technology to illuminate an illumination target surface with use of a spatial light modulation device having a plurality of individually controllable optical elements, an exposure technology using the illumination technology, and a device manufacturing technology using the exposure technology.

2. Description of the Related Art

For example, an exposure apparatus such as a stepper or a scanning stepper used in the lithography process for manufacturing electronic devices (micro devices) such as semiconductor devices is provided with an illumination optical apparatus to illuminate a reticle (mask) under various illumination conditions and in a uniform illuminance distribution. A conventionally proposed illumination optical apparatus is one provided with a spatial light modulator of a variable multi-mirror system with a large number of microscopic mirror elements arranged in an array form and having variable inclination angles, and a fly's eye lens on which reflected beams from the mirror elements are focused, in order to set a light quantity distribution on a pupil plane of an illumination optical system to a distribution with a large light quantity in a circular region, an annular region, regions of multiple poles, or the like in accordance with an illumination condition (e.g., cf. Japanese Patent Application Laid-Open No. 2002-353105).

Furthermore, another proposed illumination optical apparatus is one provided with two spatial light modulators illuminated with beams in respective polarization states different from each other, and is configured to control light quantity distributions on the pupil plane of beams from the two spatial light modulators independently of each other, in order to control a plurality of secondary light sources or a distribution of polarization states of secondary light sources of a predetermined shape on the pupil plane as an illumination condition (e.g., cf. U.S. Patent Published Application No. 2009/0109417).

SUMMARY

According to an embodiment, an illumination optical apparatus which illuminates an illumination target surface through use of a beam, comprises: a light splitting device which splits the beam into a plurality of beams with respective polarization states different from each other; a spatial light modulation device which is arranged on at least one of a first optical path in which a first beam out of the plurality of beams travels and a second optical path in which a second beam out of the plurality of beams travels, and which has a plurality of optical elements arranged two-dimensionally and driven individually; and a control device which controls the spatial modulation device to combine the first beam and the second beam at least in part.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

FIG. 3A is an exemplary drawing showing inclination angles of some of a plurality of mirror elements in two spatial light modulators 13A, 13B in quadrupolar illumination, FIG. 3B is an exemplary drawing showing secondary light sources of quadrupolar illumination, FIG. 3C is an exemplary drawing showing optical paths of some illumination beams from two spatial light modulators 13A, 13B in forming secondary light sources polarized in an approximately circumferential direction, and FIG. 3D is an exemplary drawing showing secondary light sources polarized in an approximately circumferential direction;

FIG. 4A is an exemplary drawing showing an enlarged view of some mirror elements in spatial light modulators 13A, 13B in FIG. 3C, FIG. 4B is an exemplary drawing showing polarization states of light incident to entrance surface 22I in FIG. 4A, and FIG. 4C is an exemplary drawing showing a variety of possible polarization states of resultant light from beams coming from two spatial light modulators 13A, 13B;

FIG. 5A is a drawing showing an enlarged view of some other mirror elements in spatial light modulators 13A, 13B in FIG. 3C, FIG. 5B is an exemplary drawing showing polarization states of light incident to entrance surface 22I in FIG. 5A, FIG. 5C is an exemplary drawing showing an enlarged view of pairs of mirror elements each in two spatial light modulators 13A, 13B, and FIG. 5D is an exemplary drawing showing secondary light sources polarized in oblique directions;

DETAILED DESCRIPTION

Various embodiments will be described hereinafter with reference to the accompanying drawings.

Figure 1:
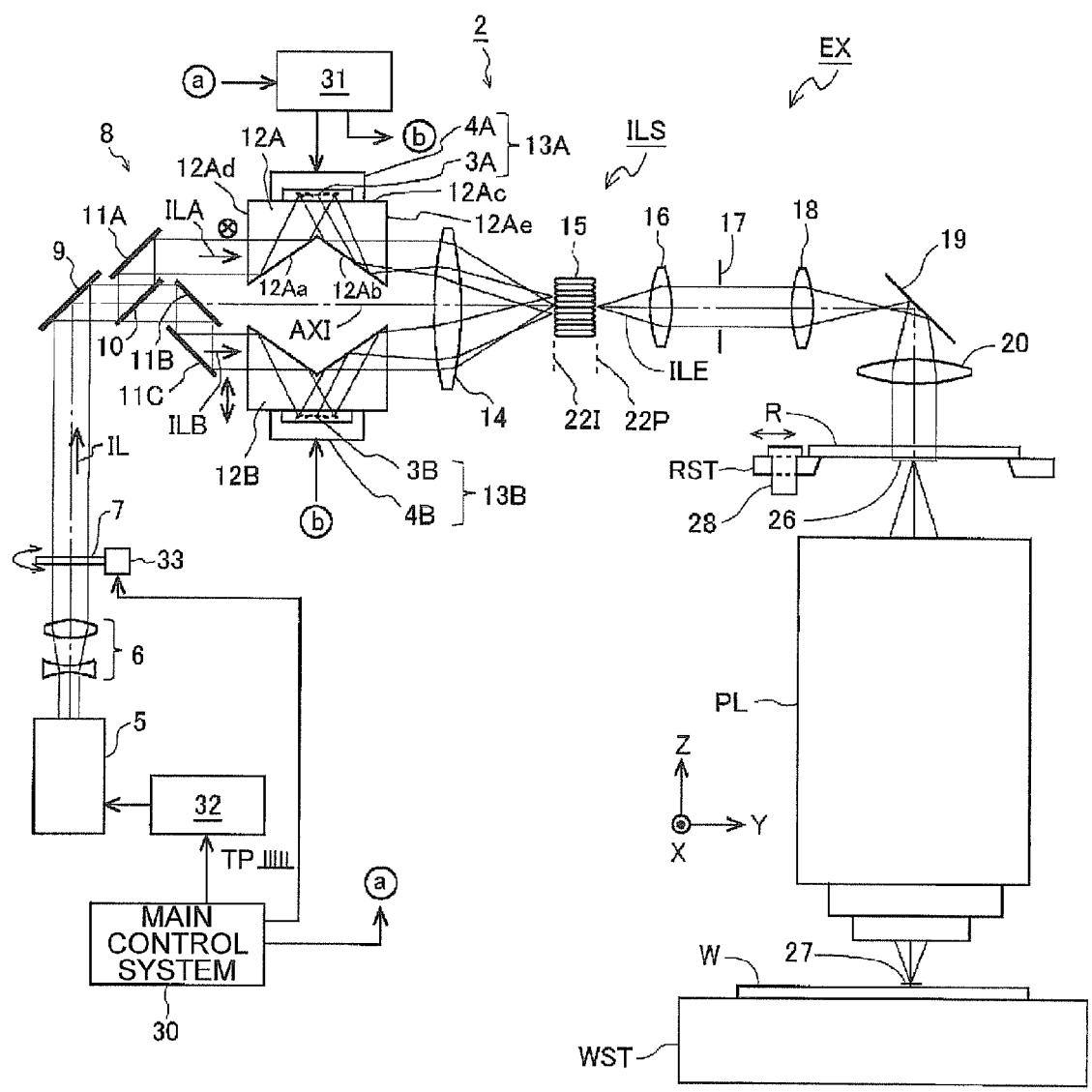
FIG. 1 is an exemplary drawing showing a schematic configuration of an exposure apparatus as an example of the embodiment.

FIG. 1 shows an exemplary schematic configuration of a scanning exposure type exposure apparatus (projection exposure apparatus) EX consisting of a scanning stepper in the present embodiment. In FIG. 1, the exposure apparatus EX is provided with an illumination device 2 configured to illuminate a reticle surface (illumination target surface) which is a pattern surface of reticle R (mask), with illumination light for exposure (exposure light) IL. The illumination device 2 is provided with a light source 5 which emits pulses of illumination light IL, and an illumination optical system ILS which illuminates an illumination region 26 on the reticle surface with the illumination light IL from the light source 5. Furthermore, the exposure apparatus EX is provided with a reticle stage RST to move the reticle R, a projection optical system PL to project an image of a pattern on the reticle R onto a surface of wafer W (substrate), a wafer stage WST to move the wafer W, a main control system 30 consisting of a computer for generally controlling the operation of the entire device, various control systems, and so on.

The description hereinbelow will be based on such a coordinate system that the Z-axis is set in parallel with the optical axis of the projection optical system PL, the Y-axis is set along a direction parallel to the plane of FIG. 1 in a plane perpendicular to the Z-axis (which is an approximately horizontal plane in the present embodiment), and the X-axis is set along a direction perpendicular to the plane of FIG. 1. In the present embodiment, scanning directions of the reticle R and the wafer W during exposure are directions parallel to the Y-axis (Y-direction) and the illumination region 26 is a rectangular shape elongated in the X-direction (non-scanning direction). Furthermore, the description will be based on such definition that directions of rotation around axes parallel to the X-axis, Y-axis, and Z-axis (inclination directions) are θx direction, θy direction, and θz direction.

The light source 5 is an ArF excimer laser light source which emits pulses of 193 nm-wavelength linearly polarized laser light at frequencies of about 4 to 6 kHz. The laser light has some degree of temporal and spatial coherency. It is noted that the light source 5 applicable herein can be, for example, a KrF excimer laser light source to supply laser light at the wavelength of 248 nm, or a harmonic generator which generates a harmonic of laser light emitted from a solid-state laser light source (YAG laser, semiconductor laser, or the like). A power supply 32 is connected to the light source 5. The main control system 30 supplies emission trigger pulses TP to indicate the timing and light quantity (pulse energy) of pulse emission, to the power supply 32. The power supply 32 makes the light source 5 emit pulses in synchronism with the emission trigger pulses TP.

The illumination light IL consisting of a nearly parallel beam of linearly polarized laser light emitted from the light source 5 is incident into a beam expander 6 to be expanded into a predetermined cross-sectional shape. The illumination light IL emitted from the beam expander 6 travels through the illumination optical system ILS having the optical axis AXI so that it passes through a polarization optical system having a half wave plate 7 to rotate the direction of polarization of the illumination light IL by an arbitrary angle, and a driving unit 33 to rotate the half wave plate 7 under control of the main control system 30. A depolarizer to convert the polarization state of the illumination light IL to random polarization (unpolarized light) may be provided in the polarization optical system, as disclosed in U.S. Pat. No. 7,423,731. The teachings in U.S. Pat. No. 7,423,731 are incorporated herein by reference.

The illumination light IL passing through the half wave plate 7 is reflected into the +Y-direction by a mirror 9 and thereafter travels via a light splitting system 8, a first prism 12A, a second prism 12B, a below-described spatial light modulation device, and a relay optical system 14 to impinge on an entrance surface 22I of fly's eye lens 15 (optical integrator). The spatial modulation device herein is provided with a first spatial light modulator 13A and a second spatial light modulator 13B.

The illumination light IL reflected into the +Y-direction by the mirror 9 is incident along the optical axis AXI into the light splitting system 8. The light splitting system 8 has a polarization beam splitter 10 which splits the illumination light IL into a first illumination beam ILA of s-polarized light as reflected light and a second illumination beam ILB of p-polarized light as transmitted light, a mirror 11A which reflects the illumination beam ILA into the +Y-direction, and two mirrors 11B, 11C which shift the illumination beam ILB into the −Z-direction and then reflect it into the +Y-direction. The illumination beam ILA of X-directionally linearly polarized light emitted from the light splitting system 8 then travels via the first prism 12A, the first spatial light modulator 13A, the first prism 12A, and the relay optical system 14 with a predetermined focal length to impinge on the entrance surface 22I of fly's eye lens 15 (optical integrator). On the other hand, the illumination beam ILB of Z-directionally linearly polarized light (which is polarized in the direction corresponding to the Y-direction on the reticle surface) emitted from the light splitting system 8 then travels via the second prism 12B, the second spatial light modulator 13B, the second prism 12B, and the relay optical system 14 to impinge on the entrance surface 22I of the fly's eye lens 15. The prisms 12A, 12B comprised of an optical material such as fluorite ($CaF_2$) or silica glass to transmit the illumination light IL have the same configuration, and the spatial light modulators 13A, 13B of a movable multi-mirror system also have the same configuration. Furthermore, the prisms 12A, 12B and the spatial light modulators 13A, 13B each are arranged in symmetry with respect to the optical axis AXI. The configurations of the first prism 12A and the first spatial light modulator 13A will be mainly described below as representative components.

The first prism 12A has an entrance face 12Ad and an exit face 12Ae perpendicular to an axis parallel to the optical axis AXI, a first reflecting face 12Aa intersecting at about 60° clockwise around an axis parallel to the X-axis with the entrance face 12Ad, a second reflecting face 12Ab approximately symmetric with the first reflecting face 12Aa with respect to a plane parallel to the XZ plane, and a transmissive face 12Ac parallel to the XY plane and perpendicular to the entrance face 12Ad (and the exit face 12Ae).

The first spatial light modulator 13A has a large number of mirror elements 3A consisting of microscopic mirrors which are arranged in a two-dimensional array pattern and each of which is variable in inclination angles in the θx direction and θy direction, and variable in Z-position, and a driving unit 4A which individually drives these mirror elements 3A. The large number of mirror elements 3A in the spatial light modulator 13A are arranged as a whole approximately in parallel and in proximity to the transmissive face 12Ac. As an example, a reflecting face of each mirror element 3A is approximately parallel to the transmissive face 12Ac, at the center in variable ranges.

The second spatial light modulator 13B also has a large number of mirror elements 3B consisting of microscopic mirrors which are arranged in a two-dimensional array pattern and each of which is variable in inclination angles in the θx direction and θy direction, and variable in Z-position, and a driving unit 4B which individually drives these mirror elements 3B. The large number of mirror elements 3B in the spatial light modulator 13B are arranged in proximity to the transmissive face of the second prism 12B. The illumination device 2 is provided with a modulation control unit 31 which controls operations of the spatial light modulators 13A, 13B, and the driving units 4A, 4B of the spatial light modulators 13A, 13B. The main control system 30 supplies to the modulation control unit 31, information of an illumination condition (a light quantity distribution and a distribution of polarization states on below-described illumination pupil plane 22P) and the emission timing of illumination light IL. The modulation control unit 31 controls the driving units 4A, 4B so that the inclination angles around the two axes and the Z-positions of the large number of mirror elements 3A, 3B are maintained at values according to the illumination condition, during a duration of pulse emission of illumination light IL.

In this case, the first illumination beam ILA is incident in parallel to the optical axis AXI into the entrance face 12Ad of the first prism 12A. The incident illumination beam ILA is totally reflected by the first reflecting face 12Aa and thereafter passes through the transmissive face 12Ac to impinge on the large number of mirror elements 3A in the spatial light modulator 13A. Then the illumination light ILA reflected and wavefront-divided by the large number of mirror elements 3A is again incident to the transmissive face 12Ac, and thereafter is totally reflected by the second reflecting face 12Ab to be emitted from the exit face 12Ae. Therefore, the angle of the first reflecting face 12Aa to the entrance face 12Ad may be set in such a range that the beam normally incident to the entrance face 12Ad is totally reflected by the first reflecting face 12Aa and that the beam totally reflected by the first reflecting face 12Aa passes through the transmissive face 12Ac. In this case, where the reflecting face of a certain mirror element 3A is approximately parallel to the transmissive face 12Ac, the illumination beam ILA reflected by the mirror element 3A travels through the transmissive face 12Ac, is totally reflected by the second reflecting face 12Ab, and thereafter travels through the exit face 12Ae to be emitted approximately in parallel to the optical axis AXI. Therefore, by controlling the inclination angles around the two axes of each mirror element 3A, it is feasible to control angles in the two directions (θx direction and θz direction) perpendicular to an axis parallel to the optical axis AXI, of the illumination beam ILA reflected by the mirror element 3A and emitted from the prism 12A. Furthermore, the Z-position (position in the Z-direction) of each mirror element 3A is also individually controllable and the optical path length of the illumination beam reflected by each mirror element 3A can also be controlled by this control of the Z-position. The control of the angles of the illumination beam ILA relative to the axis parallel to the optical axis AXI (direction of optical path) and the optical path length thereof is spatial modulation by each mirror element 3A in the present embodiment.

Similarly, the second illumination beam ILB incident into the second prism 12B is wavefront-divided by the large number of mirror elements 3B in the second spatial light modulator 13B, and beams resulting from the wavefront division are individually spatially modulated by the mirror elements 3B so as to be controlled each in angles in the θx direction and θy direction and in Z-position, to be emitted from the exit face of the prism 12B. Total reflection is employed herein for the reflecting faces 12Aa, 12Ab, etc. in the prisms 12A, 12B, but it should be noted that it is also possible to adopt a configuration wherein a reflecting film is formed on each of the reflecting faces 12Aa, 12Ab, etc. so that the illumination beam ILA, ILB can be reflected by the reflecting film. It is also possible to use, for example, a pair of plane mirrors on each side with their reflecting faces being arranged on the reflecting faces 12Aa, 12Ab, etc., in place of the prisms 12A, 12B.

Then the illumination beams ILA, ILB emitted from the prisms 12A, 12B travel through the relay optical system 14 to be combined at least in part according to needs to impinge on the entrance surface 22I of the fly's eye lens 15. The fly's eye lens 15 is an optical element in which a large number of biconvex lens elements are arranged in nearly close contact with each other in the Z-direction and the X-direction. The entrance surface 22I is approximately optically conjugate with the reticle surface and a cross-sectional shape of each lens element in the fly's eye lens 15 is a rectangular shape approximately similar to the illumination region 26 on the reticle surface.

Figure 2A:
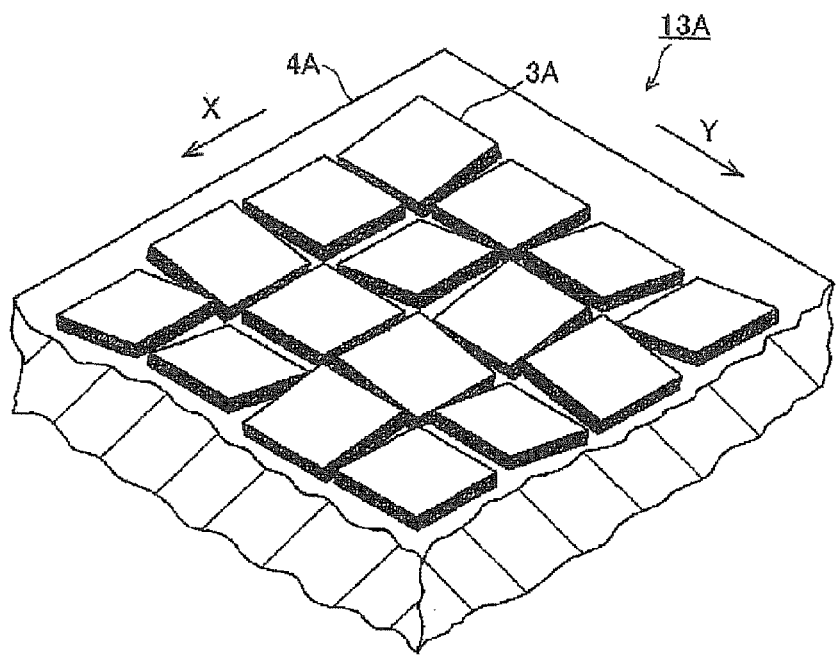
FIG. 2A is an exemplary enlarged perspective view showing a part of spatial light modulator 13 in FIG. 1.

A representative configuration example of the first spatial light modulator 13A will be described below. FIG. 2A is an exemplary enlarged perspective view showing a part of the spatial light modulator 13A. In FIG. 2A, the spatial light modulator 13A includes a large number of mirror elements 3A arranged in nearly close contact at a constant pitch in the X-direction and Y-direction, and a driving unit 4A. The number of mirror elements 3A arranged in the X-direction and the Y-direction is, for example, 100.

Figure 2B:
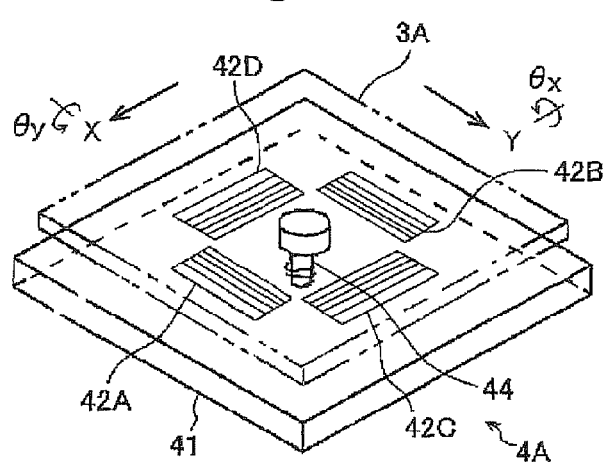
FIG. 2B is an exemplary enlarged perspective view showing a driving unit of one mirror element 3A in FIG. 2A.

As an example, as shown in FIG. 2B, a driving mechanism (driving unit 4A) for a mirror element 3A represented by a chain double-dashed line includes a spring member 44 supporting the mirror element 3A to a support member 41, four electrodes 42A, 42B, 42C, and 42D formed on a surface of the support member 41, and electrodes (not shown) formed on a back surface of the mirror element 3A. The spring member 44 may be a small hinge mechanism capable of being elastically deformed. The mirror element 3A and driving unit 4A can be manufactured, for example, by the so-called MEMS (Microelectromechanical Systems) technology.

Figure 2C:
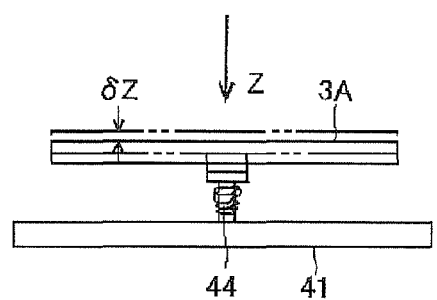
FIG. 2C is an exemplary drawing showing a state in which mirror element 3A is driven in Z-direction.

In FIG. 2B, the inclination angle in the θy direction of the mirror element 3A can be controlled by a balance between voltages applied to the electrodes 42A, 42B, and the inclination angle in the θx direction of the mirror element 3A can be controlled by a balance between voltages applied to the electrodes 42C, 42D. Furthermore, the position (Z-position) of the reflecting face of the mirror element 3A in a normal direction (which is approximately the Z-direction) can be controlled by equal increase or decrease of the voltages to the four electrodes 42A-42D, as shown in FIG. 2C which is a side view of the driving mechanism of FIG. 2B. In the present status, the mirror element 3A is, for example, a microscopic plane mirror approximately 10 μm square to several ten μm square (e.g., 48 μm square), and the inclination angles in the θx direction and θy direction of the mirror element 3A are approximately ±several deg to ±10 deg. For allowing fine change of illumination condition, the mirror elements 3 are preferably as small as possible.

A possible range of control amount δZ for the Z-position of mirror element 3A is, for example, approximately several hundred nm. In the present embodiment, the wavelength of the illumination beam ILA reflected by the mirror element 3A is 193 nm and a change amount of optical path length of the illumination beam ILA against control amount δZ for the Z-position of mirror element 3A is approximately 2×δZ. For this reason, the optical path length of the illumination beam ILA can be subjected to 360° phase change by simply changing the Z-position of the mirror element 3A by about 100 nm. In the spatial light modulator 13A of the present embodiment (and similarly in the spatial light modulator 13B as well), the optical path length in terms of phase of the illumination beam ILA (ILB) reflected by each mirror element 3A (3B) can be controlled in the range of 0° to 360°, by controlling the Z-position of each mirror element 3A (3B). Furthermore, the spatial light modulators 13A, 13B are provided with a temperature stabilizing mechanism (not shown), for example, of a system of flowing a refrigerant controlled at a predetermined temperature, through a pipe, for stabilizing temperature.

The driving mechanisms of mirror elements 3A applicable herein can be any other mechanisms. Furthermore, the mirror elements 3A are approximately square plane mirrors, but the shape thereof may be any shape such as a rectangular shape. However, in terms of efficiency of utilization of light, it is preferable to adopt a shape allowing an array without clearance. A gap between adjacent mirror elements 3A is kept preferably to a necessity minimum. As the spatial light modulators 13A, 13B, it is also possible to use the spatial light modulators as disclosed, for example, in European Patent Publication EP 779530, U.S. Pat. Nos. 6,900,915, and 7,095, 546. The teachings in European Patent Publication EP 779530, U.S. Pat. Nos. 6,900,915, and 7,095,546 are incorporated herein by reference.

FIG. 3A and FIG. 3C each show the optical system from the light splitting system 8 to the fly's eye lens 15 shown in FIG. 1. In FIG. 3A and FIG. 3C, the large number of mirror elements 3A, 3B in the spatial light modulators 13A, 13B are typically represented by a plurality of mirror elements 3A1-3A7, 3B1-3B7. In the present embodiment, as shown in FIG. 3A, the reflecting faces of the respective mirror elements 3A1, 3B1 etc. in the spatial light modulators 13A, 13B are arranged approximately on front focal planes of the relay optical system 14 and the entrance surface 22I of the fly's eye lens 15 is arranged on a rear focal plane of the relay optical system 14. In this configuration, let $\theta A$ be an inclination angle in the $\theta x$ direction, relative to an axis parallel to the optical axis AXI, of a ray incident into the relay optical system 14 along a plane including the optical axis AXI and being parallel to the ZY plane and f be the focal length of the relay optical system 14; then a height hA (position in the Z-direction) from the optical axis AXI of a position where the ray is focused on the entrance surface 22I of the fly's eye lens 15 can be calculated approximately as follows.

$$hA = f \tan \theta A \quad (1)$$

In formula (1), the inclination angle $\theta A$ is a value calculated according to the inclination angle in the $\theta x$ direction of the reflecting face of each mirror element 3A1 or the like (value set in the modulation control unit 31) and the inclination angle is not affected by the Z-position of the mirror element 3A1. Similarly, the position in the X-direction of the ray on the entrance surface 22I can also be calculated from the inclination angle in the $\theta y$ direction of the mirror element 3A1 or the like. In the spatial light modulator 13B, the X-directional and Y-directional irradiation positions on the entrance surface 22I of a ray reflected by each mirror element 3B1 or the like can also be calculated from the inclination angles in the $\theta x$ direction and $\theta y$ direction of each mirror element 3B1 or the like.

In this case, light sources by the respective lens elements (secondary light sources) are formed on a pupil plane of the illumination optical system ILS (which will be referred to hereinafter as illumination pupil plane) 22P where a rear focal plane of each lens element in the fly's eye lens 15 (plane near an exit surface) is located. In other words, a light quantity distribution of the illumination beams ILA, ILB on the entrance surface 22I of the fly's eye lens 15 is substantially equal to a light quantity distribution on the illumination pupil plane 22P on the exit surface side of the fly's eye lens 15. Accordingly, the light quantity distribution of the illumination beams ILA, ILB (the shape of secondary light sources) on the illumination pupil plane 22P can be controlled to an arbitrary distribution, by individually controlling the inclination angles around the two axes of all the mirror elements 3A1, 3B1 etc. in the spatial light modulators 13A, 13B. In practice, the main control system 30 supplies information of a light quantity distribution as a target on the illumination pupil plane 22P (or, eventually, on the entrance surface 22I) to the modulation control unit 31. The modulation control unit 31 calculates target values of the inclination angles in the $\theta x$ direction and $\theta y$ direction of the reflecting faces of the respective mirror elements 3A1 and others from formula (1) and the like and sets these inclination angles in the driving units 4A, 4B of the spatial light modulators 13A, 13B.

In the present embodiment, by guiding a beam from one or more mirror elements 3A in the spatial light modulator 13A and a beam from one or more mirror elements 3B in the spatial light modulator 13B to an identical point on the entrance surface 22I of the fly's eye lens 15 and controlling an optical path length difference (phase difference) between the beam from the spatial light modulator 13A and the beam from the spatial light modulator 13B, the polarization state of the illumination light at that point, or, eventually, the polarization state of the illumination light on the illumination pupil plane 22P corresponding to that point can be controlled to almost any state (the details of which will be described below).

In the example of FIG. 3A, the reflected beams from the spatial light modulators 13A and 13B are guided to illumination regions 25A, 25B at two locations spaced in the Z-direction and to illumination regions 25C, 25D at two locations spaced in the X-direction, respectively, on the entrance surface 22I of the fly's eye lens 15. On the illumination pupil plane 22P, as shown in FIG. 3B, secondary light sources 24A, 24B, 24C, and 24D of four poles having much the same intensity distribution as the illumination regions 25A-25D are formed at positions corresponding to the illumination regions 25A-25D.

For example, when the pattern surface (reticle surface) of the reticle R in FIG. 1 is exposed mainly with two line-and-space patterns arranged at the pitch close to the resolution limit in each of the X-direction and the Y-direction, the secondary light sources on the illumination pupil plane 22P are set to the quadrupolar illumination shown in FIG. 3B. Similarly, the spatial light modulators 13A, 13B can be controlled so as to set the secondary light sources (light quantity distribution) on the illumination pupil plane 22P to an arbitrary shape such as those of a circular shape for ordinary illumination, those for annular illumination, those of two poles in the X-direction, or those of two poles in the Y-direction. Furthermore, the spatial light modulators 13A, 13B can also be controlled, for example in FIG. 3B, so as to change the spacing between the secondary light sources 24A, 24B (24C, 24D) and/or the individual sizes of the secondary light sources 24A-24D to arbitrary values.

Next, in FIG. 1, the illumination light ILE from the secondary light sources formed on the illumination pupil plane 22P travels via a first relay lens 16, a reticle blind (field stop) 17, a second relay lens 18, a path bending mirror 19, and a condenser optical system 20 to illuminate the illumination region 26 on the reticle surface in a superimposed manner so as to obtain a uniform illuminance distribution. The illumination optical system ILS is constructed including the optical members from the beam expander 7 to the condenser optical system 20. The optical members including the spatial light modulators 13A, 13B and the fly's eye lens 15 in the illumination optical system ILS are supported on an unillustrated frame.

A pattern in the illumination region 26 of the reticle R is projected through the projection optical system PL telecentric on both sides (or telecentric on the wafer side only), to be focused at a predetermined projection magnification (e.g., ¼, ⅕, or the like) in an exposure region 27 on one shot area of the wafer W coated with a resist (photosensitive material).

The reticle R is held by suction on a top surface of the reticle stage RST and the reticle stage RST is mounted on a top surface of an unillustrated reticle base (surface parallel to the XY plane) so as to be movable at a constant speed in the Y-direction and movable at least in the X-direction, Y-direction, and θz direction. The two-dimensional position of the reticle stage RST is measured by an unillustrated laser interferometer and, based on the measurement information, the main control system 30 controls the position and speed of the reticle stage RST through a driving system (not shown) such as a linear motor.

Furthermore, a polarization measuring device 28 is disposed at a position Y-directionally close to the reticle R on the reticle stage RST. The reticle stage RST is driven to set a light receiving section of the polarization measuring device 28 in the illumination region 26, whereby the polarization measuring device 28 measures a distribution of polarization states by degrees of polarization represented by Stokes parameters of the illumination light ILE on a light receiving surface conjugate with the illumination pupil plane 22P and supplies the measurement result to the main control system 30. The polarization measuring device 28 applicable herein can be, for example, the polarization measuring device as disclosed in Japanese Patent Application Laid-Open No. 2006-179660. The light receiving section of the polarization measuring device 28 can be one that receives just a partial beam in the illumination region 26.

On the other hand, the wafer W is held by suction on a top surface of the wafer stage WST through a wafer holder (not shown) and the wafer stage WST is arranged so as to be movable in the X-direction and the Y-direction and movable at a constant speed in the Y-direction on a top surface (surface parallel to the XY plane) of an unillustrated wafer base. The two-dimensional position of the wafer stage WST is measured by an unillustrated laser interferometer and, based on the measurement information, the main control system 30 controls the position and speed of the wafer stage WST through a driving system (not shown) such as a linear motor. For alignment of the reticle R and the wafer W, the wafer stage WST is provided with a spatial image measuring system (not shown) to measure positions of images of alignment marks on the reticle R and a wafer alignment system (not shown) to detect positions of alignment marks on the wafer W is disposed on the side face of the projection optical system PL.

During exposure of the wafer W by the exposure apparatus EX, the main control system 30 selects an illumination condition (the shape of secondary light sources and distribution of polarization states on the illumination pupil plane 22P) according to the pattern of the reticle R and sets the selected illumination condition in the modulation control unit 31. In response to it, the modulation control unit 31 individually controls the inclination angles of the respective mirror elements 3A, 3B in the spatial light modulators 13A, 13B to set the shape of secondary light sources on the illumination pupil plane 22P and, if necessary, controls the Z-positions of predetermined mirror elements 3B in the spatial light modulator 13B to adjust the distribution of polarization states. Subsequently, the wafer W is moved to a scan start position by step movement of the wafer stage WST. Thereafter, the pulse emission of the light source 5 is initiated and under the illumination light ILE, while exposing a part of a shot area on the wafer W with an image of a part of the pattern on the reticle R by the projection optical system PL, the reticle R and the wafer W are moved in synchronism at a speed ratio of the projection magnification in the Y-direction through the reticle stage RST and the wafer stage WST, thereby implementing scanning exposure in the shot area on the wafer W. By the step-and-scan operation to repeat the step movement and scanning exposure of the wafer W as described above, all shot areas on the wafer W are exposed with the image of the pattern on the reticle R.

The following will describe an example of a method for controlling the distribution of polarization states on the illumination pupil plane 22P, according to the illumination condition set by the illumination device 2 in FIG. 1. First, in a case where the polarization states of the illumination light ILE from the secondary light sources of an arbitrary shape on the illumination pupil plane 22P are to be set to linear polarization in the X-direction, the angle of rotation of the half wave plate 7 is so adjusted that the direction of polarization of the illumination light IL incident into the polarization beam splitter 10 of the light splitting system 8 becomes the X-direction. This adjustment nulls the light quantity of the illumination beam ILB incident to the spatial light modulator 13B and therefore the shape of the secondary light sources is set by only the spatial light modulator 13A, with the polarization direction being the X-direction. On the other hand, in a case where the polarization states of the illumination light ILE from the secondary light sources of an arbitrary shape on the illumination pupil plane 22P are to be set to linear polarization in the Z-direction, the angle of rotation of the half wave plate 7 is so adjusted that the polarization direction of the illumination light IL incident to the polarization beam splitter 10 of the light splitting system 8 becomes the Z-direction. This adjustment nulls the light quantity of the illumination beam ILA incident to the spatial light modulator 13A and thus the shape of the secondary light sources is set by only the spatial light modulator 13B, with the polarization direction being the Z-direction.

It is assumed below that the polarization states of the secondary light sources of an arbitrary shape on the illumination pupil plane 22P include X-directionally linear polarization and Z-directionally linear polarization and the rotation angle of the half wave plate 7 is so adjusted that the illumination light IL incident into the polarization beam splitter 10 of the light splitting system 8 is polarized in a direction intersecting at 45° with the X-axis (or the Z-axis). At this time, the two illumination beams ILA, ILB with mutually perpendicular polarization directions split by the polarization beam splitter 10 come to have the same light quantity.

It is then assumed that, when the quadrupolar illumination in FIG. 3B is set, the polarization states of illumination light in the secondary light sources 24A, 24B on both sides of the optical axis AXI in the Z-direction on the illumination pupil plane 22P are set to X-directionally linear polarization and the polarization states of illumination light in the secondary light sources 24C, 24D on both sides of the optical axis AXI in the X-direction are set to Z-directionally linear polarization. This can be implemented by illuminating the illumination regions 25A, 25B on the entrance surface 22I corresponding to the secondary light sources 24A, 24B, with the illumination beam ILA from the plurality of mirror elements 3A1 and others in the spatial light modulator 13A and illuminating the illumination regions 25C, 25D on the entrance surface 22I corresponding to the secondary light sources 24C, 24D, with the illumination beam ILB from the plurality of mirror elements 3B1 and others in the spatial light modulator 13B in FIG. 3A. When each of the polarization states of the secondary light sources is X-directionally or Z-directionally linear polarization as in this case, the illumination can be implemented by illuminating the illumination regions corresponding to the respective secondary light sources with the illumination light from the spatial light modulator 13A or 13B.

Next, let us assume a situation in which, by the illumination device 2, the light quantity distribution of illumination light on the illumination pupil plane 22P is set, for example, to a distribution with a large light quantity in eight secondary light sources 24A-24H of a nearly circular shape arranged at intervals of 45° around the optical axis AXI, as shown in FIG. 3D. Furthermore, the distribution of polarization states of the secondary light sources 24A-24H on the illumination pupil plane 22P is assumed to be set to linear polarization with the polarization direction approximately being the circumferential direction around the optical axis AXI. Let us approximate this situation as follows: the polarization directions of the secondary light sources 24A, 24B and 24C, 24D on both sides of the optical axis AXI in the Z-direction and in the X-direction are set to the X-direction and the Z-direction, respectively, and the polarization directions of the secondary light sources 24E, 24F and 24G, 24H on both sides of the optical axis AXI in directions intersecting at 45° and −45° clockwise with the X-axis are set to directions DE and DG, respectively, intersecting at 45° and −45° counterclockwise with the X-axis.

In this case, the illumination regions corresponding to the secondary light sources 24A, 24B and 24C, 24D can be illuminated with the illumination beams ILA and ILB, respectively, from the spatial light modulators 13A and 13B only. For setting the polarization directions in the secondary light sources 24E, 24F to the direction DE, the illumination region 25E and another on the entrance surface 22I corresponding to the secondary light sources 24E, 24F are illuminated with coherently combined light of the illumination beams ILA, ILB with the same light quantity from both of the spatial light modulators 13A, 13B.

For coherently combining the illumination beams from the spatial light modulators 13A, 13B in this manner, first, when a partial beam (e.g., IL1) of the incident illumination light IL is split by the polarization beam splitter 10, as shown in FIG. 3A, a mirror element in the spatial light modulator 13A to which one beam of the split beam IL1 or the like is incident is assumed to be a mirror element 3A7 and a mirror element in the spatial light modulator 13B to which the other beam of the split beam IL1 or the like is incident is assumed to be a mirror element 3B7. Namely, the coherent beams are incident to the corresponding mirror elements 3A7 and 3B7. Similarly, it is also assumed that coherent beams resulting from splitting of an identical beam are also incident to each of the mirror element 3A1 and others in the spatial light modulator 13A and the mirror element 3B1 and others in the spatial light modulator 13B.

In this case, when a reflected light beam from any one of the mirror elements 3A1-3A7 (e.g., 3A7) in the spatial light modulator 13A and a reflected light beam from any one of the mirror elements 3B1-3B7 (e.g., 3B7) corresponding thereto in the spatial light modulator 13B are guided to an identical point on the entrance surface 22I, the two reflected light beams (illumination beams ILA, ILB) are coherently combined at that point. Then, let us assume as an example that, as shown in FIG. 3C, the reflected beam from the mirror element 3A7 in the spatial light modulator 13A and the reflected beam from the mirror element 3B7 in the spatial light modulator 13B are incident to the illumination region 25E corresponding to the secondary light source 24E.

FIG. 4A is a drawing showing an enlarged view of the mirror elements 3A7, 3B7 in the spatial light modulators 13A, 13B in FIG. 3C. In FIG. 4A, beams L1A and L1C resulting from splitting of the beam IL1 by the polarization beam splitter 10 are reflected by the mirror elements 3A7 and 3B7 and coherently combined at the same point in the illumination region 25E, and a resultant beam L1E is emitted from the fly's eye lens 15. Furthermore, directions of electric vector EVA of the beam L1A and electric vector EVB of the beam L1C in the illumination region 25E are the X-direction and the Z-direction, respectively, as shown in FIG. 4B.

Furthermore, for example, let us suppose that the Z-position of the mirror element 3B7 in the spatial light modulator 13B is adjusted by δZ7 to modify the beam L1C to a beam L1D indicated by a dashed line; then the beam L1D is incident to the same position as the beam L1A and the phase difference δθAC between the beams L1A and L1D can be set to an arbitrary value. When the phase difference δθAC is 0°, 90°, and 180°, the beam L1E resulting from coherent combination of the beams L1A, L1D is linearly polarized light with the electric vector E1 in a direction intersecting at 45° counterclockwise with the X-direction, circularly polarized light with the electric vector E4 rotating, and linearly polarized light with the electric vector E7 in a direction intersecting at 45° clockwise with the X-axis, respectively, in FIG. 4C. When the phase difference δθAC is between 0° and 90° or between 90° and 180°, the electric vector of the beam L1E is E2, E3 or E5, E6, respectively, in FIG. 4C. Therefore, when the Z-position of the mirror element 3B7 in the spatial light modulator 13B is controlled so as to adjust the phase difference between the beams L1A, L1C (L1D), the polarization state of the beam L1E combined and emitted by the fly's eye lens 15 can be set to any one of the various polarization states in FIG. 4C.

In the present embodiment, when the phase difference δθAC is set at 0°, the polarization state of the beam L1E resulting from combination of the beams L1A, L1C becomes polarized light with the electric vector E1, i.e., linearly polarized light in the direction DE of the secondary light source 24E in FIG. 3D. Similarly, the polarization direction of the secondary light source 24F can also be set to the direction DE.

Furthermore, let us assume that, as shown in FIG. 5A, beams L3A and L3C resulting from splitting of the same beam IL3 by the polarization beam splitter 10 are reflected by mirror elements 3A3 and 3B3, respectively, in the spatial light modulators 13A and 13B and the reflected beams L3A, L3C are incident to the illumination region 25G corresponding to the secondary light source 24G on the entrance surface 22I. In this case, the polarization state of a beam L3E emitted from the fly's eye lens 15 after coherent combination of the beams L3A, L3C can be controlled to an arbitrary state by adjusting a control amount δZ3 of the Z-position of the mirror element 3B3 in the spatial light modulator 13B. A beam after the adjustment of the Z-position of the mirror element 3B3 is assumed to be a beam L3D of a dashed line. In this case, as shown in FIG. 5B, the electric vector EVA of the beam L3A and the electric vector EVB of the beam L3C (L3D) are the X-direction and the Z-direction, and therefore the polarization direction of the resultant beam L3E can be set to the direction DG of the secondary light source 24G in FIG. 3D, by setting the phase difference between the beams L3A, L3C (L3D) to 180° shown in FIG. 4C. Similarly, the polarization direction in the secondary light source 24H can also be set to the direction DG.

In this manner, by controlling the Z-positions of predetermined mirror elements 3B7, 3B3, etc. in the spatial light modulator 13B, the polarization directions of the secondary light sources 24E, 24F and 24G, 24H in FIG. 3D can be set to the directions DE and DG intersecting at 45° with the X-axis. Instead of the adjustment of the Z-positions of the mirror elements 3B in the spatial light modulator 13B or in parallel with the adjustment of the Z-positions of the mirror elements 3B, the same effect can be achieved by adjusting the Z-positions of the mirror elements 3A in the spatial light modulator 13A as well.

Next, let us assume that, as shown in FIG. 5D, two secondary light sources 24I, 24J on both sides of the optical axis AXI in a direction intersecting approximately at 22.5° clockwise with the X-axis are the secondary light sources on the illumination pupil plane 22P and the polarization directions of illumination beams passing through the secondary light sources 24I, 24J are set to a direction DI intersecting approximately at 22.5° clockwise with the Z-axis. In this case, as shown in FIG. 5C, beams L1A, L1C resulting from splitting of the beam IL1 by the polarization beam splitter 10 are guided to an identical point in the illumination region 25I on the entrance surface 22I corresponding to the secondary light source 24I via the mirror elements 3A7, 3B7 in the spatial light modulators 13A, 13B. Furthermore, only a beam L3C out of beams L3A, L3C resulting from splitting of a beam IL2 (with high spatial coherency) close to the beam IL1 by the polarization beam splitter 10 is guided to a point where the beam L1C in the illumination region 25I is guided via another mirror element 3B6 in the spatial light modulator 13B. On this occasion, another beam L3A of the split beam is guided via the mirror element 3A6 in the spatial light modulator 13A, for example, to outside the entrance surface 22I.

Furthermore, the Z-positions of the mirror elements 3B7, 3B6 in the spatial light modulator 13B are adjusted to positions P1, P2 and the phases of electric vectors EVC1, EVC2 (cf. FIG. 5D) of the beams L1C, L3C are made identical to the phase of the electric vector EVA of the beam L1A. By this adjustment, the polarization state of the beam L1E resulting from combination of the beam L1A from the spatial light modulator 13A and the beams L1C, L3C from the spatial light modulator 13B in the illumination region 25I becomes linear polarization approximately parallel to the direction DI.

Let us generalize this operation on the assumption that the modulation control unit 31 controls n1 (n1 is an integer of one or more) mirror elements 3A in the spatial light modulator 13A and n2 (n2 is an integer of one or more) mirror elements 3B in the spatial light modulator 13B to guide reflected light from the n1 mirror elements 3A and reflected light from the n2 mirror elements 3B to an identical point on the entrance surface 22I. At this time, a ratio of light quantities of the reflected light beams (illumination beams) from the spatial light modulators 13A and 13B at the identical point is controlled to n1:n2 which is a ratio of the numbers of mirror elements.

In this case, if the phase difference is 0 between the reflected light from the n1 mirror elements 3A in the spatial light modulator 13A and the reflected light from the n2 mirror elements 3B in the spatial light modulator 13B, the polarization state of the resultant beam on the illumination pupil plane 22P is linear polarization with the electric vector having a ratio of X-component and Z-component of n1:n2. On the other hand, if the phase difference is 180° between the reflected light from the n1 mirror elements 3A and the reflected light from the n2 mirror elements 3B, the polarization state of the resultant beam on the illumination pupil plane 22P is linear polarization with the electric vector having a ratio of X-component and Z-component of n1:−n2. Therefore, by controlling the ratio of the number n1 of mirror elements 3A and the number n2 of mirror elements 3B to generate the reflected light beams to be combined, the polarization state of the illumination light on the illumination pupil plane 22P can be set to linear polarization in almost any direction.

An example of an exposure method including an illumination method by the exposure apparatus EX of the present embodiment will be described below with reference to the exemplary flowchart of FIG. 6. This operation is controlled by the main control system 30.

Figure 6:
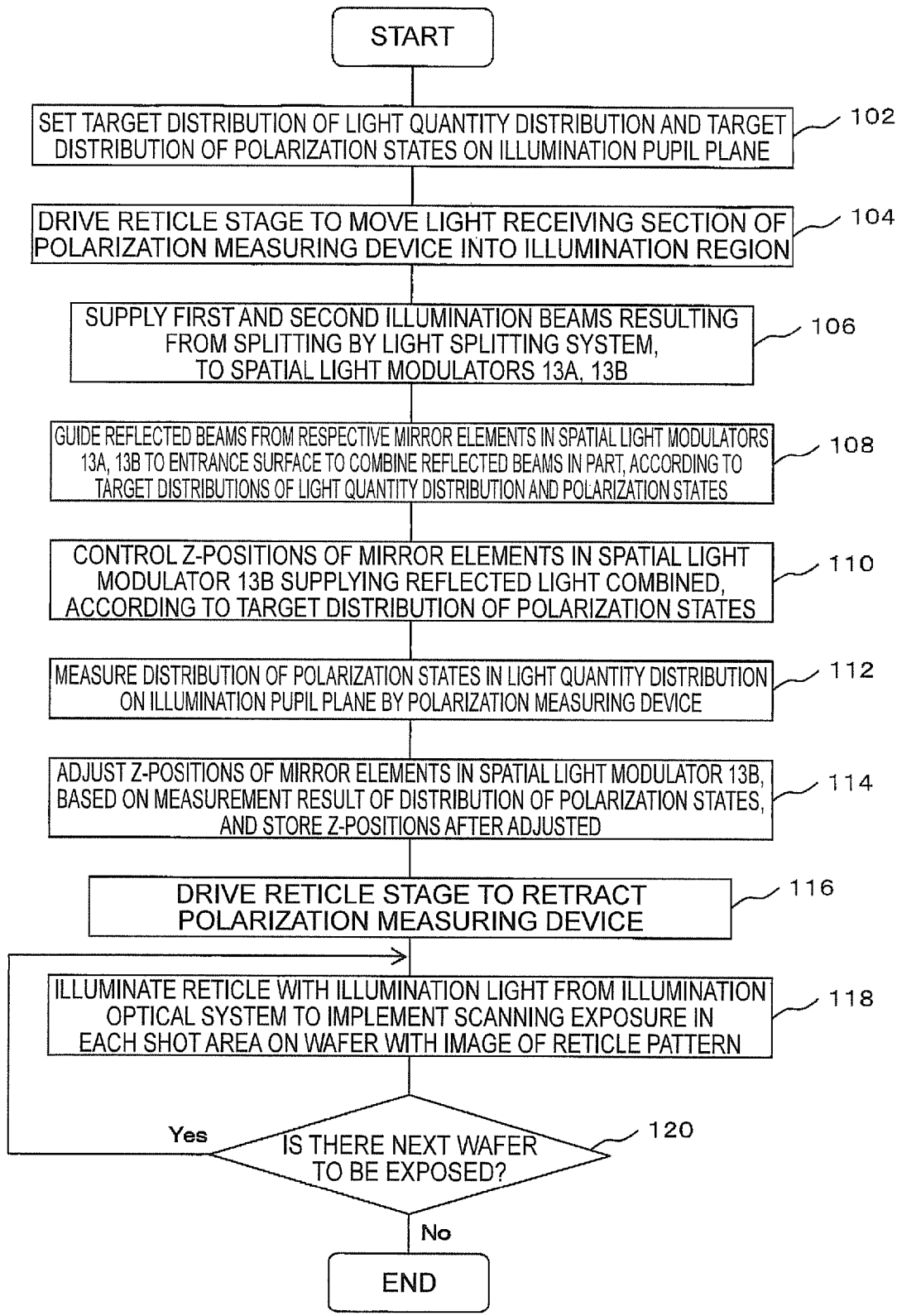
FIG. 6 is an exemplary flowchart showing an example of an exposure method including an illumination method.

First, in block 102 in FIG. 6, the main control system 30 reads information of a target distribution for light quantity distribution and a target distribution for polarization states on the illumination pupil plane 22P, for example, from an exposure data file, according to the pattern of the reticle R as an exposure target, and sets the target distributions of light quantity distribution and polarization states in the modulation control unit 31. The target distribution of polarization states is assumed to include polarization states except for linear polarization in directions parallel to the X-axis and the Z-axis. In response to it, the modulation control unit 31 controls the inclination angles around the two axes of the respective mirror elements 3A, 3B in the spatial light modulators 13A, 13B and controls the Z-positions of the mirror elements 3B used for the control of polarization states of the spatial light modulator 13B, so as to achieve the target distributions of the light quantity distribution and polarization states. In next block 104, the reticle stage RST is driven to move the light receiving section of the polarization measuring device 28 into the illumination region 26. In next block 106, the emission of light from the light source 5 is initiated to supply the first illumination beam ILA and the second illumination beam ILB resulting from splitting by the light splitting system 8, to the spatial light modulators 13A, 13B, respectively. In next block 108, the reflected beams (illumination beams ILA, ILB) from the respective mirror elements 3A, 3B in the spatial light modulators 13A, 13B are guided to the entrance surface 22I of the fly's eye lens 15 and the reflected beams are combined in part on the entrance surface 22I.

In next block 110, the Z-positions of the mirror elements 3B (e.g., the mirror element 3B7 in the case of FIG. 3B) in the spatial light modulator 13B to supply the reflected beams to be combined are controlled according to the target distribution of polarization states. On this occasion, it is assumed that in a state in which the Z-positions are not controlled, the phase difference is 0 between the reflected beams from the corresponding mirror elements 3A, 3B in the spatial light modulators 13A, 13B. By this operation, the polarization states of the secondary light sources on the illumination pupil plane 22P are set to a distribution close to the target distribution.

In next block 112, the polarization measuring device 28 measures the distribution of polarization states in the light quantity distribution on a plane conjugate with the illumination pupil plane 22P, or, eventually, on the illumination pupil plane 22P, and the emission of light from the light source 5 is terminated. This measurement result is supplied to the main control system 30. In next block 114, the main control system 30 compares the measurement result of the distribution of polarization states with the target distribution of polarization states and obtains a setting error of polarization state, for each secondary light source on the illumination pupil plane 22P. This setting error is represented by magnitude and phase differences from the X- and Y-components, for example, of the electric vectors E1-E7 or the like in FIG. 4C. Then the information of setting errors of polarization states for the respective secondary light sources is supplied to the modulation control unit 31 and the modulation control unit 31 adjusts the Z-positions of the corresponding mirror elements 3B in the spatial light modulator 13B so as to correct the setting errors, and stores the Z-positions of the mirror elements 3B after the adjustment into a storage device inside the modulation control unit 31. As a consequence of this operation, the distribution of polarization states on the illumination pupil plane 22P is set to the target distribution. When the same illumination condition is used thereafter, the values stored in the storage device will be used as the Z-positions of the respective mirror elements 3B in the modulation control unit 31.

In next block 116, the reticle stage RST is driven to retract the polarization measuring device 28 and to move the reticle R to the scan start position before the illumination region 26. In next block 118, the operations of the step movement in the X-direction and Y-direction of the wafer W by the wafer stage WST and the scanning exposure to illuminate the reticle R with the illumination light from the illumination optical system ILS and scan-expose one shot area on the wafer W with an image of the pattern on the reticle R are repeatedly carried out to implement scanning exposure in each shot area on the wafer W. In next block 120, when there is a next wafer to be exposed, the scanning exposure on the next wafer is repeated in block 118. In the present embodiment, as described above, each shot area on the wafer W is exposed with the image of the pattern on the reticle R, under the illumination condition including the distribution of polarization states set corresponding to the reticle R.

Effects and others of the present embodiment are as described below.

(1) The illumination apparatus 2 (illumination optical apparatus) in the exposure apparatus EX in FIG. 1 of the present embodiment illuminates the reticle surface (illumination target surface) with the illumination light IL (beam) from the light source 5. The illumination device 2 has the light splitting system 8 to split the illumination light IL into the two illumination beams ILA, ILB with polarization directions perpendicular to each other, the spatial light modulators 13A with the plurality of mirror elements 3A arranged two-dimensionally on the optical path of the illumination beam ILA and driven individually, and the spatial light modulator 13B with the plurality of mirror elements 3B arranged two-dimensionally on the optical path of the illumination beam ILB and driven individually. Furthermore, the illumination device 2 is provided with the modulation control unit 31 (control device) configured in the configuration wherein when the secondary light sources in the polarization states different from the illumination beams ILA, ILB are generated on the illumination pupil plane 22P, the illumination beams ILA, ILB from the spatial light modulators 13A, 13B are combined at least in part on the entrance surface 22I (combining surface) of the fly's eye lens 15, and the polarization state of the resultant beam is changed to a polarization state different from the polarization states of the illumination beams ILA, ILB incident to the spatial light modulators 13A, 13B.

The illumination method using the illumination device 2 has the block 102 of setting the target distribution of polarization states of the illumination light ILE on the illumination pupil plane 22P between the spatial light modulators 13A, 13B with the mirror elements 3A and 3B and the reticle surface, the block 106 of splitting the illumination light IL into the illumination beams ILA, ILB with the polarization directions perpendicular to each other and supplying the illumination beams ILA, ILB to the respective spatial light modulators 13A, 13B, and the blocks 108, 110 of combining the beams from the spatial light modulators 13A, 13B at least in part, according to the target distribution of polarization states, and controlling the polarization state of the resultant beam to a polarization state different from the polarization states of the illumination beams incident to the spatial light modulators 13A, 13B.

In the present embodiment, the beams from the two spatial light modulators 13A, 13B are coherently combined at least in part to change the polarization state of the beam after the combination to a polarization state different from the polarization states of the illumination beams incident to the spatial light modulators 13A, 13B. Therefore, a variety of polarization states can be generated much greater than the number of spatial light modulators 13A, 13B used. For this reason, the reticle surface can be illuminated with the beams in various distributions of polarization states, with little complication or increase in scale of the device configuration.

(2) By controlling the ratio of light quantities of the beams to be combined among the beams from the spatial light modulators 13A, 13B, on the entrance surface 22I (combining surface) of the fly's eye lens 15, the polarization directions of the beams after the combination can be set to various directions except for the X-direction, the Z-direction, or the directions intersecting at 45° with the X-axis.

(3) By controlling the optical path length difference (phase difference) between the beams to be combined among the beams from the spatial light modulators 13A, 13B, the polarization states of the resultant beams can also be controlled to circular polarization or the like except for linear polarization. This circularly polarization light can also be used, for example, instead of unpolarized light.

Since the spatial light modulators 13A, 13B are the movable multi-mirror systems with the mirror elements 3A, 3B to reflect the illumination light, the optical path length difference can be controlled by controlling the positions in the normal direction (Z-positions) of the reflecting faces of the mirror elements 3A, 3B. On this occasion, since the relay optical system 14 is provided between the spatial light modulators 13A, 13B and the fly's eye lens 15, the irradiation positions of the reflected light on the entrance surface 22I of the fly's eye lens 15 are kept unchanged even with change in Z-positions of the mirror elements 3A, 3B.

The resultant beams from the combination may be controlled in both of the light quantity ratio and the optical path length difference.

(4) Since the mirror elements 3A, 3B in the spatial light modulators 13A, 13B are arranged in proximity to the transmissive faces of the prisms 12A, 12B, the illumination optical system ILS can be arranged compactly. For example, as indicated by chain double-dashed lines in FIG. 5A, the two prisms 12A, 12B may be replaced by a mirror member 52 of a nearly rhombic sectional shape with external reflecting faces serving as the two intersecting reflecting faces (internal reflecting faces) of the prisms 12A, 12B.

(5) The exposure apparatus EX of the present embodiment is provided with the illumination device 2 for illuminating the pattern (predetermined pattern) on the reticle R, and is configured to project the pattern through the projection optical system PL onto the wafer W to implement exposure of the wafer W.

The exposure method by the exposure apparatus EX includes the illumination method of the present embodiment to illuminate the pattern on the reticle surface and project the pattern through the projection optical system PL onto the wafer to implement exposure of the wafer W.

On this occasion, since the illumination device 2 or the illumination method permits generation of the illumination light in various polarization states by the simple configuration, the pattern can be illuminated with the illumination light in the polarization state suitable for the pattern. Therefore, the wafer W can be exposed with the highly accurate image of the pattern.

Figure 7A:
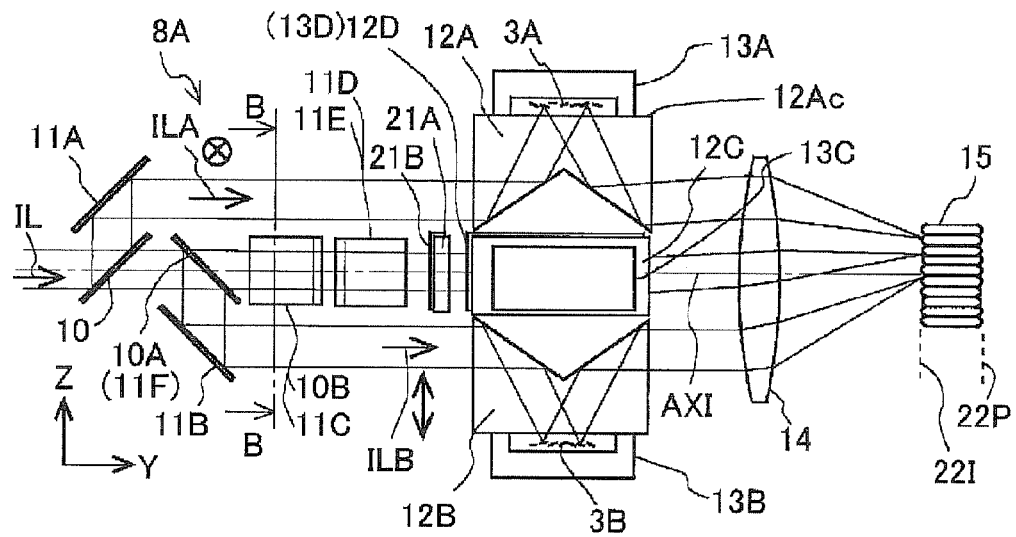
FIG. 7A is an exemplary drawing showing a major part of an illumination optical apparatus as another example of the embodiment.
Figure 7B:
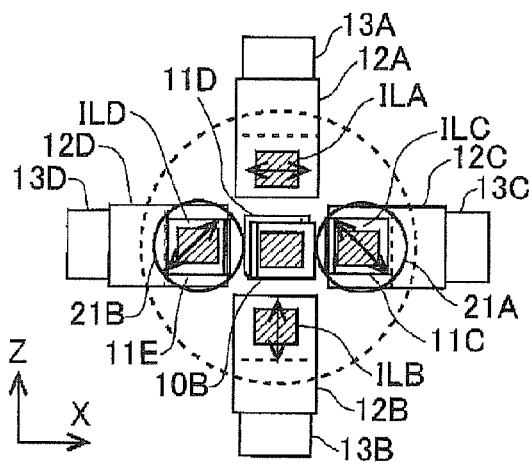
FIG. 7B is an exemplary sectional view in arrows and along the line BB in FIG. 7A.
Figure 7C:
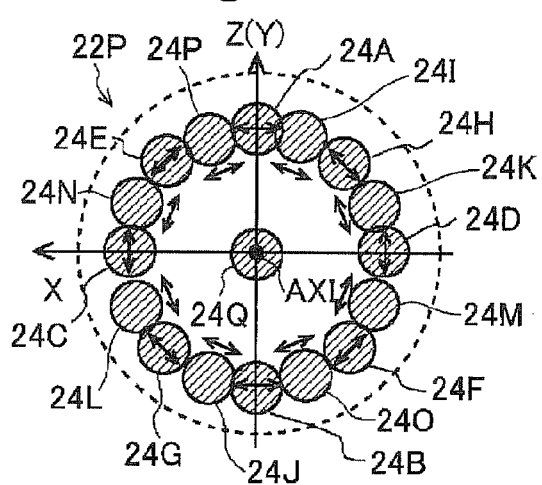
FIG. 7C is an exemplary drawing showing a distribution of polarization states of secondary light sources on illumination pupil plane 22P in FIG. 7A.

Next, another example of the embodiment will be described with reference to FIG. 7A to FIG. 7C. The illumination device of the present embodiment is different in the configuration of the optical system between mirror 9 and relay optical system 14 from the illumination device 2 in FIG. 1. In the present embodiment, third and fourth prisms 12C, 12D and third and fourth spatial light modulators 13C, 13D are provided so as to be perpendicular to the arrangement direction of the first and second prisms 12A, 12B and the first and second spatial light modulators 13A, 13B. In FIG. 7A to FIG. 7C, portions corresponding to those in FIG. 3A and FIG. 3D will be denoted by the same reference signs, without detailed description thereof.

FIG. 7A is a drawing showing the optical system from a light splitting system 8A to the fly's eye lens 15 in the illumination device of the present embodiment, FIG. 7B a cross-sectional view in arrows and along the line BB in FIG. 7A, and FIG. 7C a drawing showing an example of the shape of secondary light sources and the distribution of polarization states on the illumination pupil plane 22P in FIG. 7A. In FIG. 7A, the illumination light IL of linearly polarized light having passed via the half wave plate 7 and mirror 9 in FIG. 1 is split into a first illumination beam ILA of s-polarized light and the other illumination beam of p-polarized light by the polarization beam splitter 10 and the illumination beam ILA travels via mirror 11A and prism 12A to impinge on the large number of mirror elements 3A in the spatial light modulator 13A. Furthermore, the illumination beam of p-polarized light having passed through the polarization beam splitter 10 is split into a second illumination beam ILB of p-polarized light and the other illumination beam by a beam splitter 10A with a ratio of light quantities of reflected light and transmitted light being 1:2, and the second illumination beam ILB travels via mirror 11B and prism 12B to impinge on the large number of mirror elements 3B in the spatial light modulator 13B.

On the other hand, the illumination beam having passed through the beam splitter 10A is split into a third illumination beam ILC traveling in the +X-direction and a fourth illumination beam ILD traveling in the +Y-direction by a beam splitter 10B with a ratio of light quantities of reflected light and transmitted light being 1:1, as shown in FIG. 7B. The third illumination beam ILC is reflected into the +Y-direction by a mirror 11C and then travels via half wave plate 21A and prism 12C to impinge on a large number of mirror elements in a spatial light modulator 13C. The fourth illumination beam ILD is shifted into the −X-direction by mirrors 11D, 11E and then travels in the +Y-direction via half wave plate 21B and prism 12D to impinge on a large number of mirror elements in a spatial light modulator 13D. The prisms 12A, 12B and the spatial light modulators 13A, 13B are arranged on both sides of the optical axis AXI in the Z-direction, and the prisms 12C, 12D and spatial light modulators 13C, 13D are arranged on both sides of the optical axis AXI in the X-direction.

In the present embodiment, the polarization directions of the illumination beams ILA, ILB incident into the prisms 12A and 12B are the X-direction and Z-direction. The angles of rotation of the half wave plates 21A, 21B are so set that the polarization directions of the illumination beams ILC and ILD incident into the prisms 12A and 12B each intersect at ±45° clockwise with the X-axis. Therefore, when the angle of the polarization direction of the illumination beam ILA relative to the Z-axis is 0°, the angles of the polarization directions of the other illumination beams ILB, ILC, ILD relative to the Z-axis are 90°, 45°, and 135°. The beam splitter 10A can be replaced with a mirror 11F as occasion may demand.

Then the illumination beams ILA-ILD reflected by the large number of mirror elements in the spatial light modulators 13A-13D travel via the reflecting faces of the respective prisms 12A-12D and the relay optical system 14 to impinge on the entrance surface 22I of the fly's eye lens 15. A light splitting system 8A is constructed of the polarization beam splitter 10, the beam splitters 10A, 10B, and the mirrors 11A-11F. The illumination device of the present embodiment is provided with the light splitting system 8A, the prisms 12A-12D, the spatial light modulators 13A-13D, the modulation control unit (not shown) for the spatial light modulators 13A-13D, the relay optical system 14, and the fly's eye lens 15, and is configured to illuminate the unillustrated reticle surface with the illumination light.

In this embodiment, in a case where the polarization states of some of the secondary light sources on the illumination pupil plane 22P are changed to polarization states different from those of the illumination beams ILA-ILD incident to the spatial light modulators 13A-13D, the unillustrated modulation control unit also adjusts the reflected beams from corresponding predetermined mirror elements in the spatial light modulators 13A-13D in at least one of optical quantity ratio and optical path length difference, and then they are combined on the entrance surface 22I.

In the present embodiment, in a case where the polarization states on the illumination pupil plane 22P are controlled uniformly to linearly polarized light in the X-direction or in the Z-direction, the polarization direction of the illumination light IL incident to the polarization beam splitter 10 is set to the X-direction or the Z-direction; when the polarization direction is the Z-direction, the beam splitter 10A is further replaced with the mirror 11F. In these cases, only the reflected light from the mirror elements in the spatial light modulator 13A or 13B is guided to the entrance surface 22I.

Furthermore, let us explain a situation in which an illumination condition is set such that in the present embodiment, as shown in FIG. 7C, light quantities are large in sixteen secondary light sources 24A-24P arranged in an annular shape at equal angular intervals around the optical axis AXI and in a circular secondary light source 24Q on the optical axis AXI on the illumination pupil plane 22P, the polarization states of the secondary light sources 24A-24P are linear polarization directed approximately in the circumferential direction, and the polarization state of the center secondary light source 24Q is substantially unpolarized light. For realizing this illumination condition, an example of setting is such that the polarization direction of the illumination light IL incident to the polarization beam splitter 10 in FIG. 7A is set to a direction in which the light quantity ratio of s-polarized reflected light and p-polarized transmitted light in the polarization beam splitter 10 becomes 1:3. As a consequence of this setting, the light quantities of the illumination beams ILA-ILD incident to the prisms 12A-12D become approximately equal to each other.

Then the illumination regions on the entrance surface 22I corresponding to the secondary light sources (24A, 24B), (24C, 24D), (24G, 24H), and (24E, 24F) are illuminated with reflected beams from the spatial light modulators 13A, 13B, 13C, and 13D, respectively. Furthermore, the illumination regions corresponding to the secondary light sources 24I, 24J and 24O, 24P arranged in the directions intersecting at ±22.5° clockwise with the Z-axis are illuminated with resultant beams having the phase difference of 0 from the spatial light modulators 13A, 13C and with resultant beams having the phase difference of 0 from the spatial light modulators 13A, 13D, respectively. Moreover, the illumination regions corresponding to the secondary light sources 24M, 24N and 24K, 24L arranged in the directions intersecting at ±22.5° clockwise with the X-axis are illuminated with resultant beams having the phase difference of 0 from the spatial light modulators 13B, 13D and with resultant beams having the phase difference of 0 from the spatial light modulators 13B, 13C, respectively. Furthermore, the illumination region corresponding to the center secondary light source 24Q is illuminated, for example, with superimposed beams of low spatial coherency from the spatial light modulators 13A-13D. This arrangement allows the illumination device to achieve the distributions of secondary light sources and polarization states shown in FIG. 7C, by simple control. Similarly, various distributions of polarization states on the illumination pupil plane 22P can be readily obtained by combinations of the beams from the spatial light modulators 13A-13D.

Next, the above embodiments can be modified as described below.

(1) The foregoing embodiments use the fly's eye lens 15 as optical integrator, but a micro lens array (micro fly's eye lens) may be used as optical integrator.

(2) In the embodiment of FIG. 1, one spatial light modulator out of the spatial light modulators 13A, 13B may be configured with only the function to control the inclination angles around the two axes of the large number of mirror elements, without need for having the function to control the Z-positions of the mirror elements.

Similarly, in the embodiment of FIG. 7A, at least one spatial light modulator out of the spatial light modulators 13A-13D may be provided with only the function to control the inclination angles around the two axes of the large number of mirror elements, without need for having the function to control the Z-positions of the mirror elements.

(3) The fly's eye lens 15 as wavefront division type integrator in FIG. 1 or in FIG. 7A, for example, may be replaced by a rod type integrator as internal reflection type optical integrator.

(4) Furthermore, the embodiment of FIG. 1 may use a reflecting optical member in which a large number of reflecting surfaces are preliminarily formed, instead of the spatial light modulator 13A. In this case, the inclination angles of the large number of mirror faces formed in the reflecting optical member are set so as to adapt for the aforementioned illumination condition (e.g., to from any one of the circular secondary light sources for ordinary illumination, the secondary light sources for annular illumination, the secondary light sources of two poles in the X-direction or in the Y-direction, etc. on the illumination pupil plane 22P). For change in the illumination condition (the shape of secondary light sources on the illumination pupil plane 22P), reflecting optical members with a large number of mirror faces formed according to the shapes of secondary light sources are prepared in advance and an appropriate one is selectively used in place of the other.

When a stop for setting the illumination condition is arranged between the light splitting system 8 and the reflecting optical member, it is also possible to use a plane mirror as the reflecting optical member. This stop may be located near the reflecting optical member.

Figure 8:
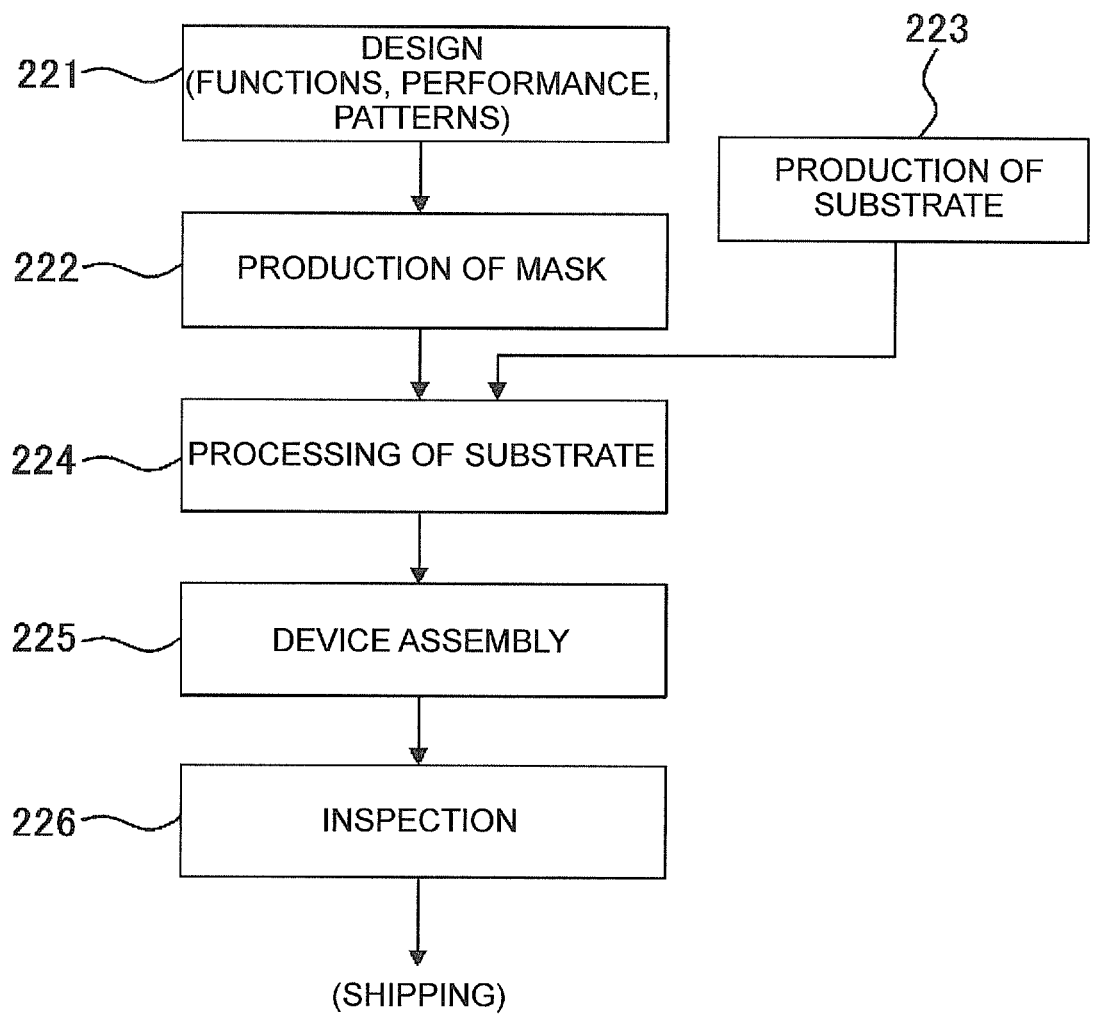
FIG. 8 is an exemplary flowchart showing an example of manufacturing blocks of electronic devices.

In manufacture of electronic devices (micro devices) such as semiconductor devices using the exposure apparatus EX or the exposure method in the above embodiments, the electronic devices are manufactured, as shown in FIG. 8, through block 221 to perform design of functions and performance of devices, block 222 to manufacture a mask (reticle) based on the design block, block 223 to manufacture a substrate (wafer) as a base material of devices, substrate processing block 224 including a block of exposing the substrate with a pattern of the mask by the exposure apparatus EX or the exposure method in the aforementioned embodiments, a block of developing the exposed substrate, and heating (curing) and etching blocks of the developed substrate, device assembly block (including processing processes such as dicing block, bonding block, and packaging block) 225, inspection block 226, and so on.

In other words, the above device manufacturing method includes the block of exposing the substrate (wafer W) through the pattern of the mask, using the exposure apparatus EX or the exposure method in the above embodiments, and the block of processing the exposed substrate (i.e., the development block of developing the resist on the substrate to form a mask layer corresponding to the pattern of the mask on the surface of the substrate, and the processing block of processing (heating and etching or the like) the surface of the substrate through the mask layer).

Since this device manufacturing method allows the polarization states of the illumination light (exposure light) to be readily optimized according to the pattern on the mask, the electronic devices can be manufactured with high accuracy.

It is noted that the present embodiment can also be applied to the liquid immersion type exposure apparatuses, for example, as disclosed in U.S. Patent Application Laid-Open No. 2007/242247 or European Patent Application Publication EP 1 420 298. The teachings in U.S. Patent Application Laid-Open No. 2007/242247 or European Patent Application Publication EP 1 420 298 are incoparated herein by reference. Furthermore, the embodiment can also be applied to the exposure apparatus of the proximity method or the like not using the projection optical system and the illumination apparatus (illumination optical apparatus) in the exposure apparatus.

The present embodiment is not limited to the application to the manufacturing processes of semiconductor devices, but can also be generally applied, for example, to manufacturing processes of liquid crystal display devices, plasma displays, etc. and to manufacturing processes of various devices (electronic devices) such as imaging devices (CMOS type, CCD, etc.), micro machines, MEMS (Microelectromechanical Systems), thin film magnetic heads, and DNA chips.

As described above, the present embodiment can be realized in a variety of configurations without departing from the spirit and scope of the present embodiment, without having to be limited to the above embodiments.

The disclosures in the aforementioned Publications, International Publications, U.S. Patents, or Published U.S. Patent Applications described in the present specification are incorporated herein as part of the description of the present specification. The entire disclosure of Japanese Patent Application No. 2010-21853 filed on Feb. 3, 2010 including the description, the scope of claims, drawings, and abstract is incorporated herein by reference in its entirety.

It will be understood by those skilled in the art that aspects of embodiments of the subject matter disclosed above are intended to satisfy the requirement of disclosing at least one enabling embodiment of the subject matter of each claim and to be one or more such exemplary embodiments only and to not to limit the scope of any of the claims in any way and particularly not to a specific disclosed embodiment alone. Many changes and modification can be made to the disclosed aspects of embodiments of the disclosed subject matter of the claims that will be understood and appreciated by those skilled in the art, particularly in regard to interpretation of the claims for purposes of the doctrine of equivalents. The appended claims are intended in scope and meaning to cover not only the disclosed aspects of embodiments of the claimed subject matter but also such equivalents and other modifications and changes that would be apparent to those skilled in the art. In additions to changes and modifications to the disclosed and claimed aspects of the subject matter disclosed of the disclosed subject matter(s) noted above, others could be implemented.

While the particular aspects of embodiment(s) of the {TITLE} described and illustrated in this patent application in the detail required to satisfy 35 U.S.C. §112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the subject matter claimed are merely exemplary, illustrative and representative of the subject matter which is broadly contemplated by the claimed subject matter. The scope of the presently described and claimed aspects of embodiments fully encompasses other embodiments which may now be or may become obvious to those skilled in the art based on the teachings of the Specification. The scope of the present {TITLE} is solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the Specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. §112, sixth paragraph, unless the element is expressly recited using the phrase "means for" or, in the case of a method claim, the element is recited as a "step" instead of an "act."

It will be understood also be those skilled in the art that, in fulfillment of the patent statutes of the United States, Applicant(s) has disclosed at least one enabling and working embodiment of each invention recited in any respective claim appended to the Specification in the present application and perhaps in some cases only one. For purposes of cutting down on patent application length and drafting time and making the present patent application more readable to the inventor(s) and others, Applicant(s) has used from time to time or throughout the present application definitive verbs (e.g., "is", "are", "does", "has", "includes" or the like) and/or other definitive verbs (e.g., "produces," "causes" "samples," "reads," "signals" or the like) and/or gerunds (e.g., "producing," "using," "taking," "keeping," "making," "determining," "measuring," "calculating" or the like), in defining an aspect/feature/element of, an action of or functionality of, and/or describing any other definition of an aspect/feature/element of an embodiment of the subject matter being disclosed. Wherever any such definitive word or phrase or the like is used to describe an aspect/feature/element of any of the one or more embodiments disclosed herein, i.e., any feature, element, system, sub-system, component, sub-component, process or algorithm step, particular material, or the like, it should be read, for purposes of interpreting the scope of the subject matter of what applicant(s) has invented, and claimed, to be preceded by one or more, or all, of the following limiting phrases, "by way of example," "for example," "as an example," "illustratively only," "by way of illustration only," etc., and/or to include any one or more, or all, of the phrases "may be," "can be", "might be," "could be" and the like. All such features, elements, steps, materials and the like should be considered to be described only as a possible aspect of the one or more disclosed embodiments and not as the sole possible implementation of any one or more aspects/features/elements of any embodiments and/or the sole possible embodiment of the subject matter of what is claimed, even if, in fulfillment of the requirements of the patent statutes, Applicant(s) has disclosed only a single enabling example of any such aspect/feature/element of an embodiment or of any embodiment of the subject matter of what is claimed. Unless expressly and specifically so stated in the present application or the prosecution of this application, that Applicant(s) believes that a particular aspect/feature/element of any disclosed embodiment or any particular disclosed embodiment of the subject matter of what is claimed, amounts to the one an only way to implement the subject matter of what is claimed or any aspect/feature/element recited in any such claim, Applicant(s) does not intend that any description of any disclosed aspect/feature/element of any disclosed embodiment of the subject matter of what is claimed in the present patent application or the entire embodiment shall be interpreted to be such one and only way to implement the subject matter of what is claimed or any aspect/feature/element thereof, and to thus limit any claim which is broad enough to cover any such disclosed implementation along with other possible implementations of the subject matter of what is claimed, to such disclosed aspect/feature/element of such disclosed embodiment or such disclosed embodiment. Applicant(s) specifically, expressly and unequivocally intends that any claim that has depending from it a dependent claim with any further detail of any aspect/feature/element, step, or the like of the subject matter of what is claimed recited in the parent claim or claims from which it directly or indirectly depends, shall be interpreted to mean that the recitation in the parent claim(s) was broad enough to cover the further detail in the dependent claim along with other implementations and that the further detail was not the only way to implement the aspect/feature/element claimed in any such parent claim(s), and thus be limited to the further detail of any such aspect/feature/element recited in any such dependent claim to in any way limit the scope of the broader aspect/feature/element of any such parent claim, including by incorporating the further detail of the dependent claim into the parent claim.

The invention claimed is:
1. An illumination optical apparatus which illuminates an illumination target surface through use of a beam, comprising:
 a light splitting device which splits the beam into a plurality of beams with respective polarization states different from each other;
 a spatial light modulation device which is arranged on at least one of a first optical path in which a first beam out of the plurality of beams travels and a second optical path in which a second beam out of the plurality of beams travels, and which is configured to adjust a phase difference between the first beam and the second beam by changing an optical path length of the first optical path and an optical length of the second optical path; and
an optical system which illuminates the illumination target surface with light wherein the first beam and the second beam are overlapped at least in part,
wherein polarization states of the first beam and the second beam overlapped at least in part are adjusted by adjusting the phase difference between the first beam and the second beam.

2. The illumination optical apparatus according to claim 1, further comprising a controller which controls the spatial light modulation device.

3. The illumination optical apparatus according to claim 2, wherein the spatial light modulation device includes reflecting elements with inclination angles and heights controllable, and
wherein the controller controls the heights of the reflecting elements in the spatial modulation device.

4. The illumination optical apparatus according claim 2, wherein the spatial light modulation device comprises: a spatial light modulator with a plurality of optical elements arranged two-dimensionally and driven individually on the first optical path; and a reflecting optical member arranged on the second optical path and having a reflecting surface, and
wherein the controller overlaps a beam from the spatial light modulator and a beam from the reflecting optical member at least in part.

5. The illumination optical apparatus according claim 2, wherein the spatial light modulation device comprises: a first spatial light modulator with a plurality of optical elements arranged two-dimensionally and driven individually on the first optical path; and a second spatial light modulator with a plurality of optical elements arranged two-dimensionally and driven individually on the second optical path, and
wherein the controller overlaps a beam from the first spatial light modulator and a beam from the second spatial light modulator at least in part, and adjusts a polarization state of a resultant beam to a polarization state different from polarization states of the beams incident to the first and second spatial light modulators.

6. The illumination optical apparatus according to claim 5, comprising: a condensing optical system to condense the beams from the first and second spatial light modulators; a fly's eye lens arranged between the condensing optical system and the illumination target surface; and a condenser optical system to guide light from the fly's eye lens to the illumination target surface,
wherein the surface where the beams from the first and second spatial light modulators are overlapped at least in part is an entrance surface of the fly's eye lens.

7. The illumination optical apparatus according to claim 5, wherein the controller controls a ratio of light quantities of the beam from the first spatial light modulator and the beam from the second spatial light modulator, on an overlapping surface where the beam from the first spatial light modulator and the beam from the second spatial light modulator are overlapped at least in part.

8. The illumination optical apparatus according to claim 7, wherein the controller controls n1 (n1 is an integer of one or more) optical elements of the optical elements in the first spatial light modulator and n2 (n2 is an integer of one or more) optical elements of the optical elements in the second spatial light modulator, so as to control the light quantity ratio to n1:n2 being a ratio of the numbers of the optical elements.

9. The illumination optical apparatus according to claim 7, wherein the controller controls an optical path length difference between at least parts of the beams from the first and second spatial light modulators which are incident to the overlapping surface.

10. The illumination optical apparatus according to claim 6, wherein the plurality of optical elements in the second spatial light modulator include reflecting elements with inclination angles and heights controllable, and
wherein the controller controls the heights of the reflecting elements in the second spatial light modulator.

11. The illumination optical apparatus according to claim 7, wherein the spatial light modulation device further comprises third and fourth spatial light modulators with a plurality of optical elements arranged two-dimensionally on respective optical paths of third and fourth beams out of the plurality of beams,
wherein the light splitting device sets the first, second, third, and fourth beams to linearly polarized light beams with polarization directions being approximately 0°, 90°, 45°, and 135° directions, and
wherein the controller overlaps the beams from the first, second, third, and fourth spatial light modulators at least in part on the overlapping surface.

12. The illumination optical apparatus according to claim 11, wherein the plurality of optical elements in the first, second, third, and fourth spatial light modulators include mirror elements with variable inclination angles.

13. The illumination optical apparatus according to claim 1, comprising a polarization state measuring device for measuring a polarization state of the beam to illuminate the illumination target surface, which is arranged so as to be freely inserted into and retracted from an optical path of the beam.

14. An exposure apparatus comprising the illumination optical apparatus as set forth in claim 1 for illuminating a predetermined pattern, which is configured to expose a substrate with the predetermined pattern.

15. A device manufacturing method comprising:
exposing the substrate with the predetermined pattern, using the exposure apparatus as set forth in claim 14; and
processing the substrate thus exposed.

16. The illumination optical apparatus according to claim 1, wherein the spatial light modulation device comprises one or more optical surfaces arranged on a plane crossing the optical path on which the spatial light modulation is arranged, and adjusts the phase difference by changing a position of at least one of the optical surfaces in a traveling direction of the beam, said beam traveling in the optical path on which the spatial light modulation is arranged.

17. The illumination optical apparatus according to claim 16, wherein the spatial light modulation device has a plurality of optical elements arranged two-dimensionally and driven individually.

18. An illumination method of illuminating an illumination target surface through use of a beam, comprising:
setting a target distribution of polarization states of the beam, between a spatial light modulation device with a plurality of optical elements arranged two-dimensionally and driven individually, and the illumination target surface;
splitting the beam into a plurality of beams with respective polarization states different from each other;
supplying at least one of first and second beams out of the plurality of beams to the spatial light modulation device;
controlling the spatial light modulation device to change a phase difference between the first beam and the second beam; and overlapping the first beam and the second beam at least in part and adjusting a polarization state of a resultant beam so as to be different from the polarization states of the beams resulting from the splitting.

19. The illumination method according to claim 18, wherein the target distribution of polarization states is set between first and second spatial light modulators of the spatial light modulation device and the illumination target surface,
  wherein the first beam and the second beam are supplied to the first and second spatial light modulators, respectively, and
  wherein the polarization state of the resultant beam is adjusted to a polarization state different from the polarization states of the beams incident to the first and second spatial light modulators, by overlapping a beam from the first spatial light modulator and a beam from the second spatial light modulator at least in part.

20. The illumination method according to claim 19, wherein when the beams from the first and second spatial light modulators are overlapped at least in part, at least one of a ratio of light quantities of the beams from the first and second spatial light modulators and an optical path length difference between the beams is controlled.

21. The illumination method according to claim 19, wherein the target distribution of polarization states of the beam is set on an entrance surface of a fly's eye lens to which the beams from the first and second spatial light modulators are guided through a condensing optical system.

22. An exposure method comprising:
  illuminating a pattern on the illumination target surface by the illumination method as set forth in claim 18; and
  exposing a substrate with the pattern.

23. A device manufacturing method comprising:
  exposing the substrate with the predetermined pattern, using the exposure method as set forth in claim 22; and
  processing the substrate thus exposed.

* * * * *